United States Patent
Zhou et al.

(10) Patent No.: US 9,276,005 B1
(45) Date of Patent: Mar. 1, 2016

(54) NON-VOLATILE MEMORY ARRAY WITH CONCURRENTLY FORMED LOW AND HIGH VOLTAGE LOGIC DEVICES

(71) Applicant: Silicon Storage Technology, Inc., San Jose, CA (US)

(72) Inventors: Feng Zhou, Fremont, CA (US); Xian Liu, Sunnyvale, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 14/560,475

(22) Filed: Dec. 4, 2014

(51) Int. Cl.
*H01L 27/115* (2006.01)
*H01L 29/788* (2006.01)
*H01L 29/792* (2006.01)
*H01L 29/66* (2006.01)

(52) U.S. Cl.
CPC .... *H01L 27/11521* (2013.01); *H01L 27/11526* (2013.01); *H01L 29/66833* (2013.01); *H01L 29/788* (2013.01); *H01L 29/792* (2013.01)

(58) Field of Classification Search
None
See application file for complete search history.

(56) References Cited

U.S. PATENT DOCUMENTS

| | | | |
|---|---|---|---|
| 6,717,206 B2* | 4/2004 | Hsu | H01L 27/105 257/316 |
| 6,747,310 B2 | 6/2004 | Fan et al. | |
| 7,868,375 B2* | 1/2011 | Liu | H01L 21/28273 257/320 |
| 2013/0313626 A1* | 11/2013 | Huang | H01L 29/42328 257/321 |
| 2014/0138758 A1* | 5/2014 | Uozaki | H01L 21/28282 257/317 |
| 2015/0263123 A1* | 9/2015 | Cheng | H01L 29/517 257/319 |

* cited by examiner

*Primary Examiner* — Matthew Reames
*Assistant Examiner* — Steven B Gauthier
(74) *Attorney, Agent, or Firm* — DLA Piper LLP (US)

(57) ABSTRACT

A memory cell includes source and drain regions in a substrate with a channel region therebetween, an erase gate over the source region, a floating gate over a first channel region portion, a control gate over the floating gate, and a wordline gate over a second channel region portion. A first logic device includes second source and drain regions in the substrate with a second channel region therebetween under a first logic gate. A second logic device includes third source and drain regions in the substrate with a third channel region therebetween under a second logic gate. The wordline gate and the first and second logic gates comprise the same conductive metal material. The second logic gate is insulated from the third channel region by first and second insulation. The first logic gate is insulated from the second channel region by the second insulation and not by the first insulation.

9 Claims, 7 Drawing Sheets

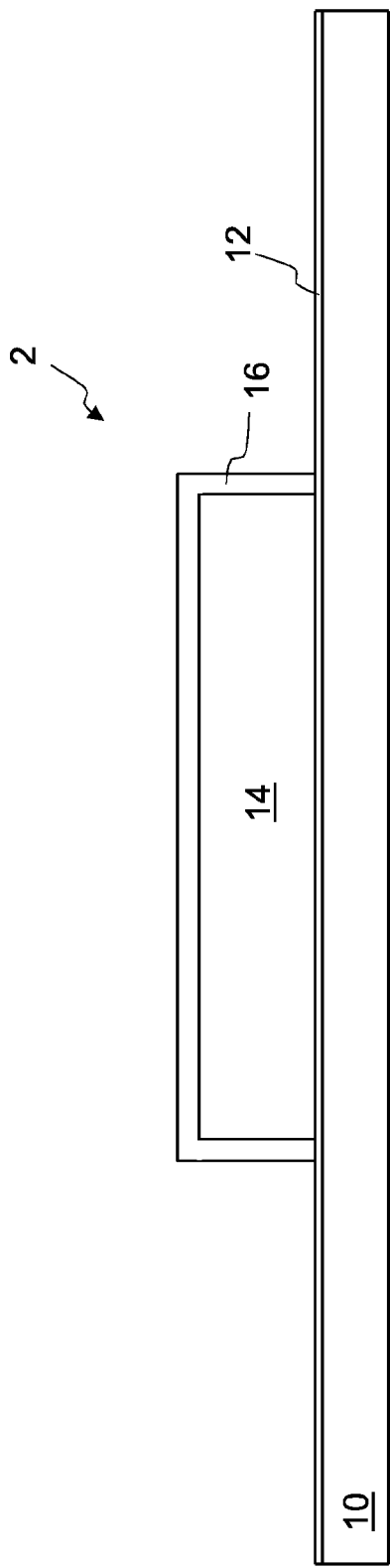
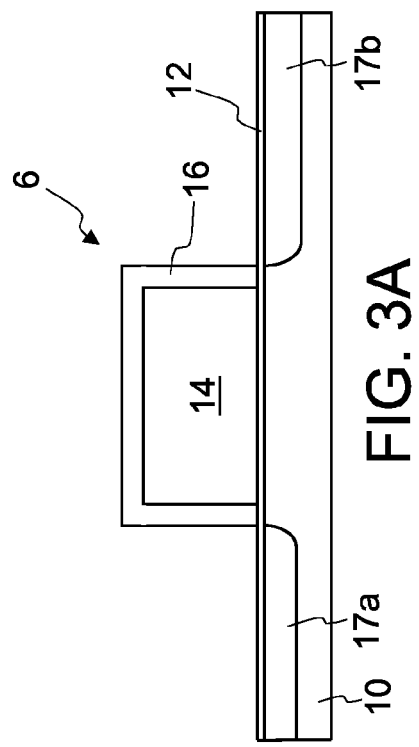
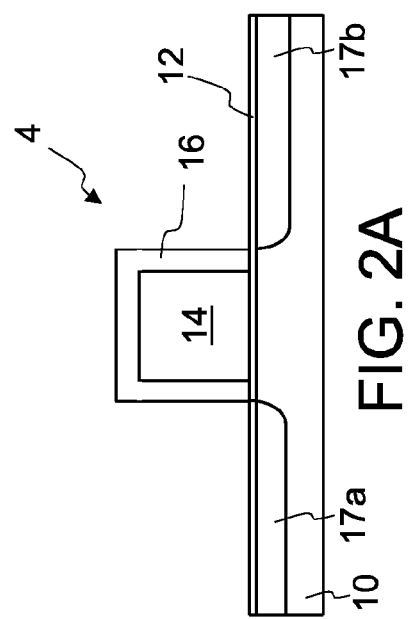

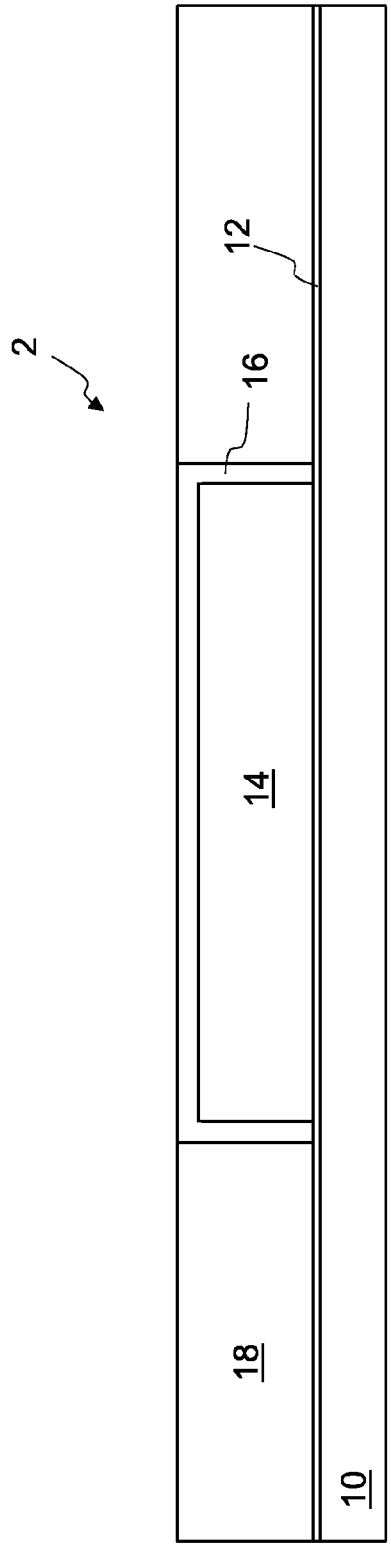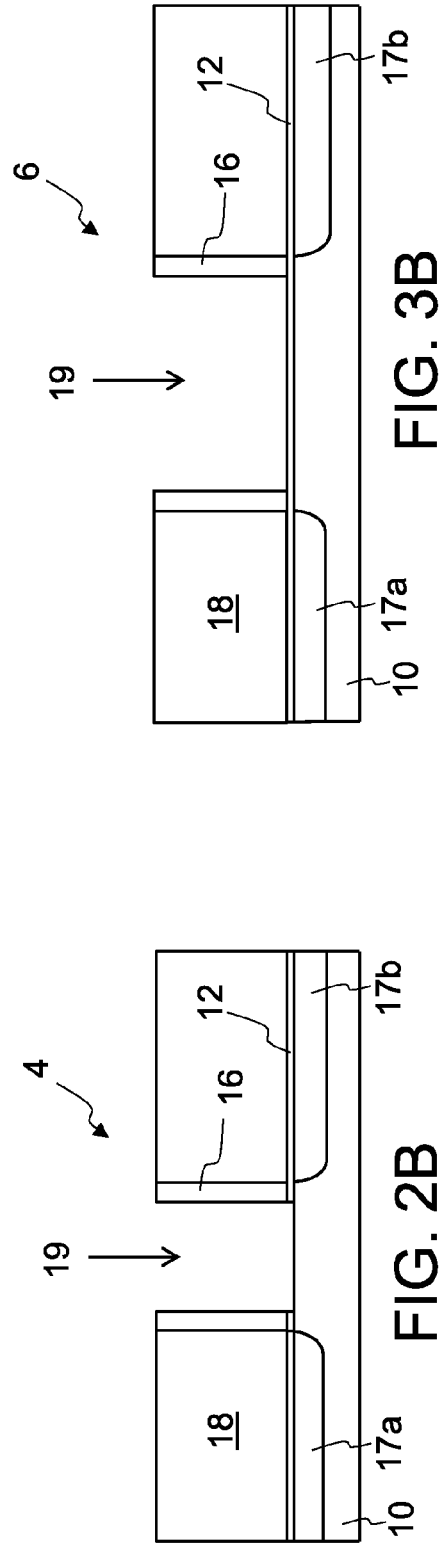

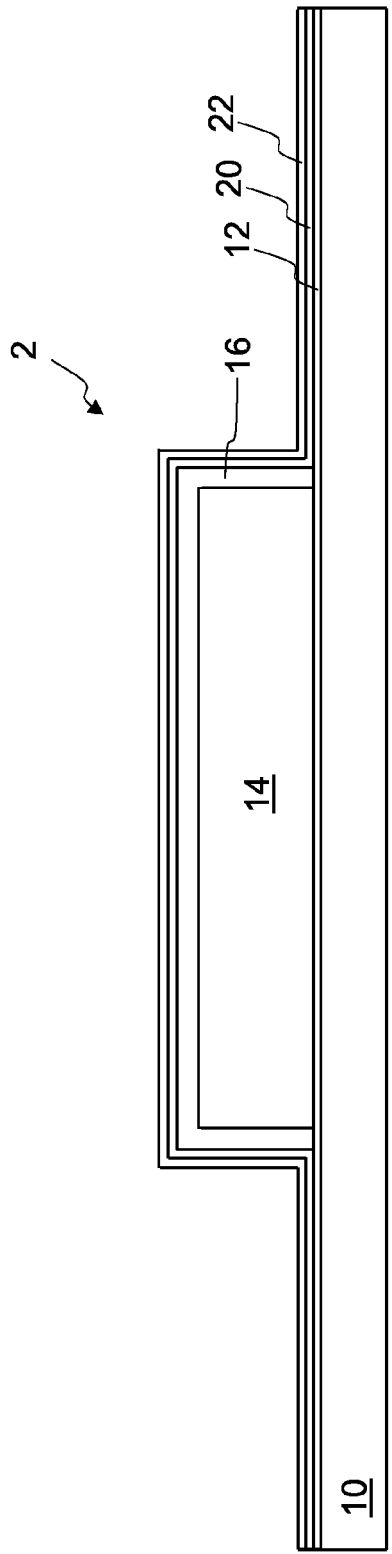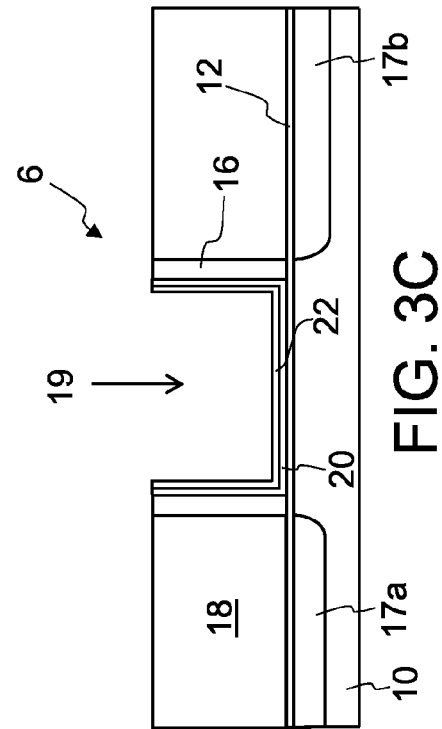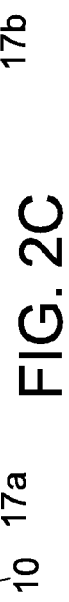

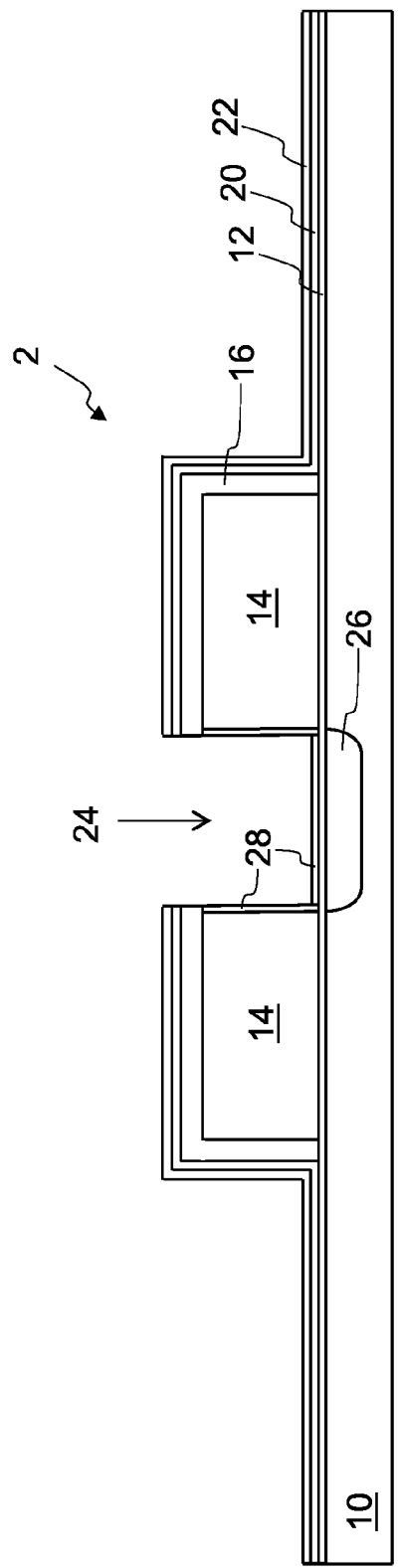
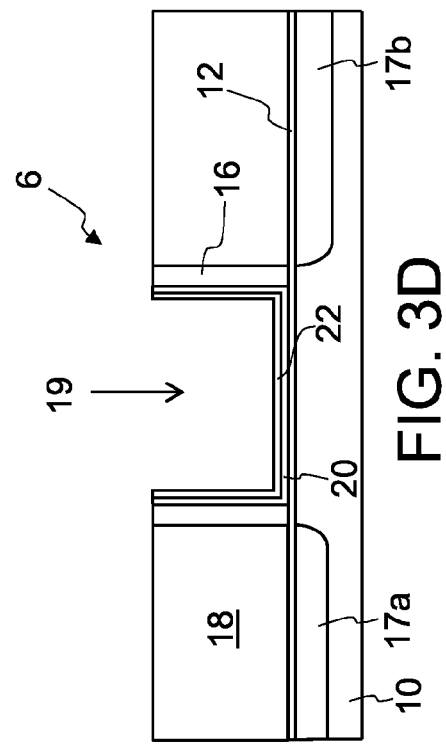
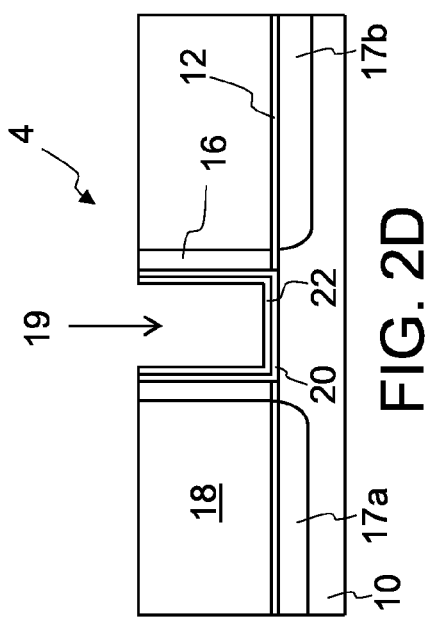
FIG. 1D
FIG. 2D
FIG. 3D

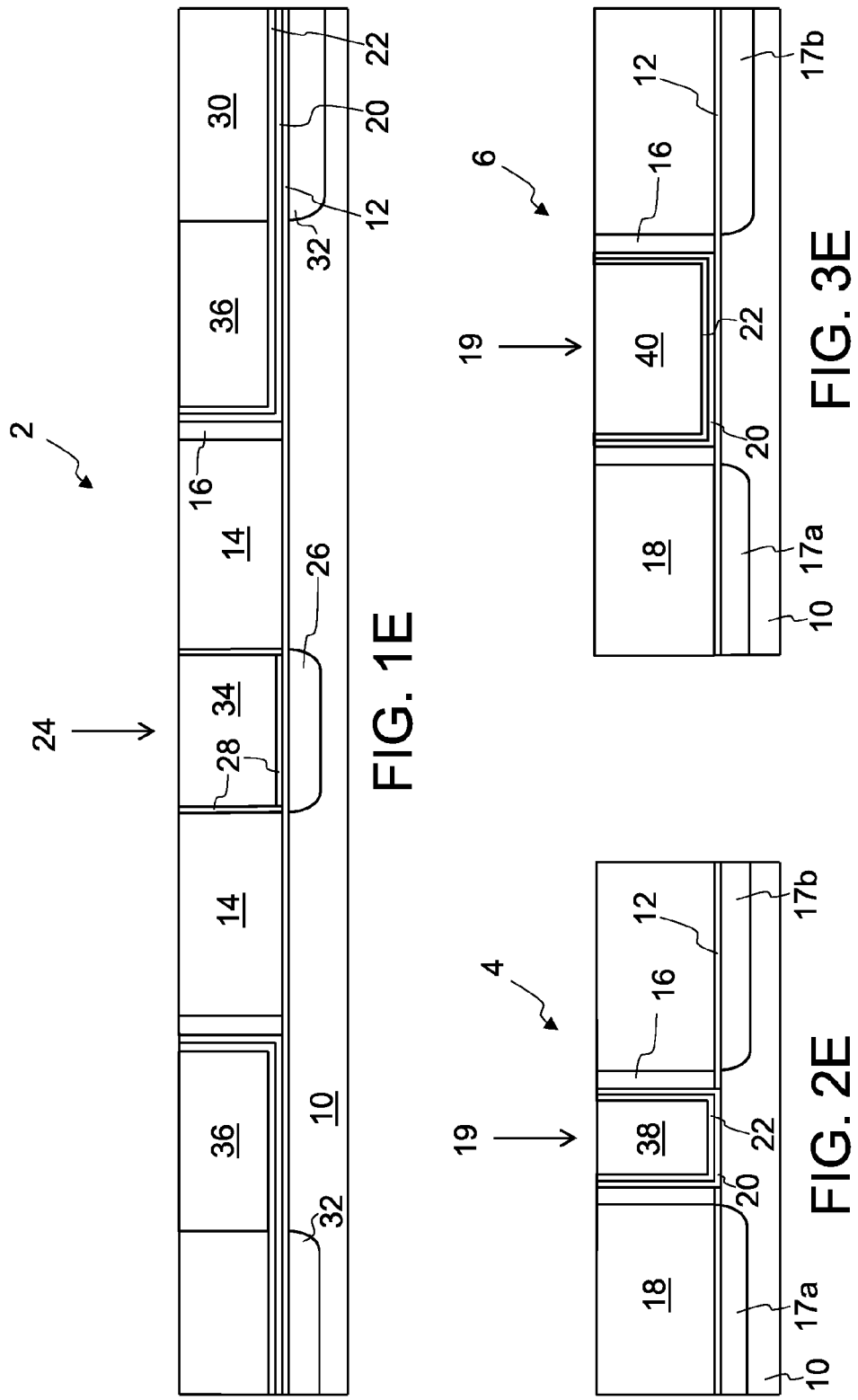

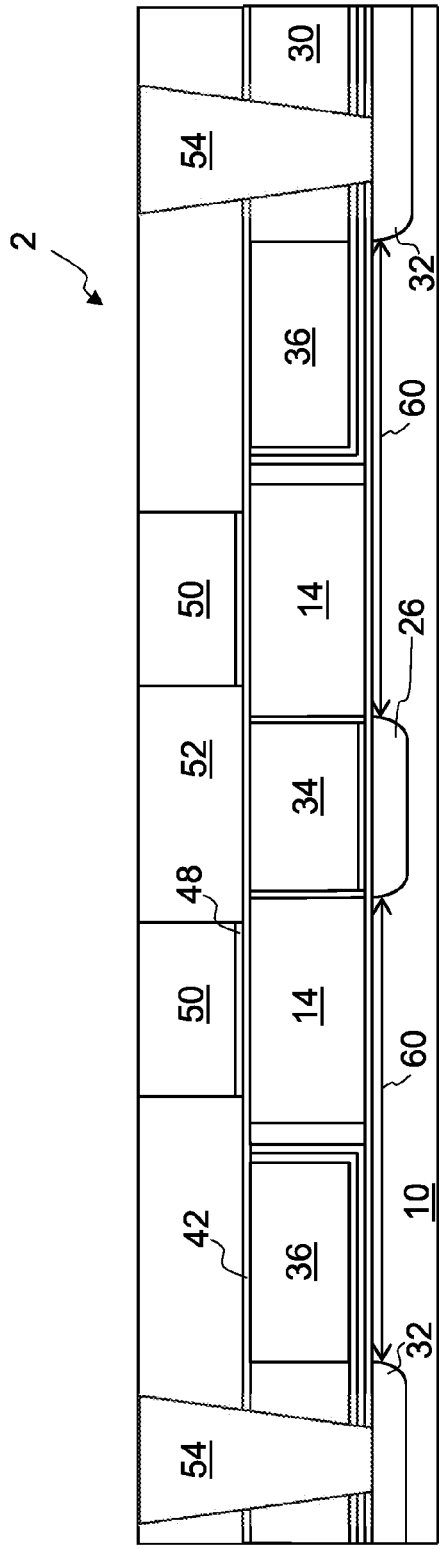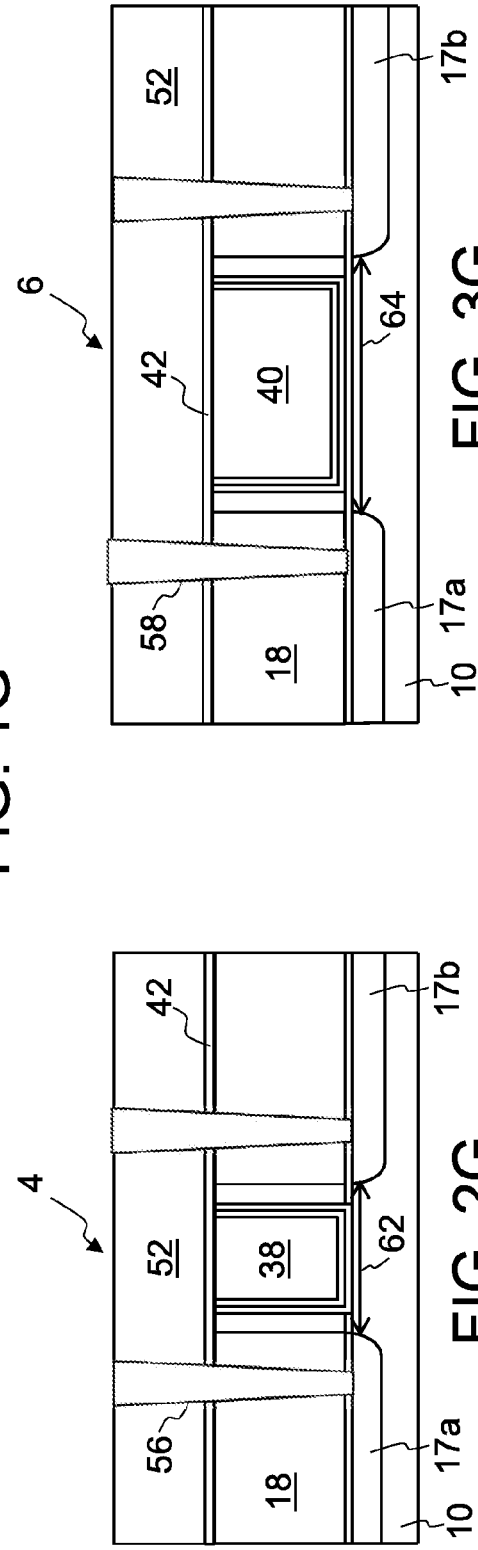

NON-VOLATILE MEMORY ARRAY WITH CONCURRENTLY FORMED LOW AND HIGH VOLTAGE LOGIC DEVICES

FIELD OF THE INVENTION

The present invention relates to non-volatile memory arrays.

BACKGROUND OF THE INVENTION

Split gate non-volatile memory cell arrays are known. U.S. Pat. Nos. 6,747,310 and 7,868,375 disclose non-volatile memory cells having four gates (floating gate, control gate, erase gate and select gate). The conductive gates are typically formed of conductive polysilicon. It is also known to form logic devices on the same silicon chip. However, processing steps in forming the memory cells can adversely affect the previously fabricated logic devices, and vice versa. Moreover, as device geometries continue to shrink, the desired performance is difficult to achieve given the conductivity of the polysilicon material used to form the conductive gates. Lastly, modern applications could benefit from the formation of logic devices with different operational thresholds on the same chip (e.g. low and high voltage logic devices on the same semiconductor chip as that containing the memory cells).

As the logic transistors scale to advanced nodes with smaller feature sizes, new gate materials (such as high-k dielectric and metal gates discussed below) are needed. There is a need for an improved memory cell array and method of fabrication that includes memory cells, low voltage logic devices and high voltage memory devices on the same substrate, and with gates made of sufficiently conductive material.

BRIEF SUMMARY OF THE INVENTION

The aforementioned problems and needs are addressed by a method of forming a semiconductor device that includes forming a memory cell, a first logic device and a second logic device on a substrate. The forming of the memory includes forming a first source region and a first drain region in the substrate, where a first channel region of the substrate is disposed between the first source region and the first drain region, forming a conductive erase gate over and insulated from the source region, forming a conductive floating gate over and insulated from a first portion of the first channel region, forming a conductive control gate over and insulated from the floating gate, and forming a word line gate over and insulated from a second portion of the first channel region. The forming of the first logic device includes forming a second source region and a second drain region in the substrate, where a second channel region of the substrate is disposed between the second source region and the second drain region, and forming a conductive first logic gate over and insulated from the second channel region. The forming of the second logic device includes forming a third source region and a third drain region in the substrate, where a third channel region of the substrate is disposed between the third source region and the third drain region, and forming a conductive second logic gate over and insulated from the third channel region. The forming of the conductive word line gate, the forming of the conductive first logic gate, and the forming of the conductive second logic gate comprise forming a conductive metal material over the substrate. The second logic gate is insulated from the third channel region by a first insulation formed over the substrate and by a second insulation formed over the substrate. The first logic gate is insulated from the second channel region by the second insulation and not by the first insulation.

A semiconductor memory device includes a semiconductor substrate, a memory cell, a first logic device and a second logic device. The memory cell includes a first source region and a first drain region in the substrate, where a first channel region of the substrate is disposed between the first source region and the first drain region, a conductive erase gate disposed over and insulated from the source region, a conductive floating gate disposed over and insulated from a first portion of the first channel region, a conductive control gate disposed over and insulated from the floating gate, and a word line gate disposed over and insulated from a second portion of the first channel region. The first logic device includes a second source region and a second drain region in the substrate, where a second channel region of the substrate is disposed between the second source region and the second drain region, and a conductive first logic gate disposed over and insulated from the second channel region. The second logic device includes a third source region and a third drain region in the substrate, where a third channel region of the substrate is disposed between the third source region and the third drain region, and a conductive second logic gate disposed over and insulated from the third channel region. The conductive word line gate, the conductive first logic gate, and the conductive second logic gate all comprise a same conductive metal material. The second logic gate is insulated from the third channel region by a first insulation disposed over the substrate and by a second insulation disposed over the substrate. The first logic gate is insulated from the second channel region by the second insulation and not by the first insulation.

Other objects and features of the present invention will become apparent by a review of the specification, claims and appended figures.

BRIEF DESCRIPTION OF THE DRAWINGS

FIGS. 1A-1G are side cross sectional views showing the sequence of steps in forming memory cells in a memory cell area of the substrate.

FIGS. 2A-2G are side cross sectional views showing the sequence of steps in forming a low voltage logic device in a low voltage logic device area of the substrate.

FIGS. 3A-3G are side cross sectional views showing the sequence of steps in forming a high voltage logic device in a high voltage logic device area of the substrate.

DETAILED DESCRIPTION OF THE INVENTION

The present invention is a process of simultaneously forming memory cells, low voltage logic devices and high voltage logic devices on the same semiconductor substrate. The process described below involves forming memory cells in one or more memory cell areas (MC areas) 2 of the substrate 10, low voltage logic devices in one or more low voltage logic device areas (LV areas) 4 of the substrate 10, and high voltage logic devices in one or more high voltage logic device areas (HV areas) 6 of the substrate 10. The process is described with respect to forming a pair of memory cells in a MC area, a low voltage logic device in an LV area, and a high voltage logic device in an HV area, simultaneously. However, multiple such devices in each area are simultaneously formed.

Figure 1F:
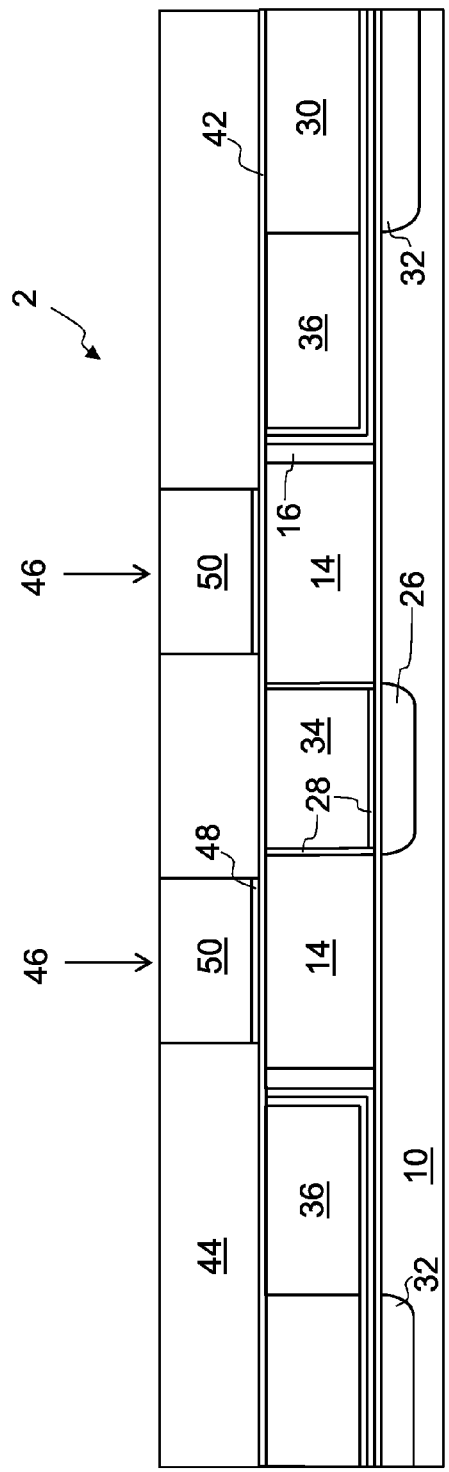
Figure 3F:
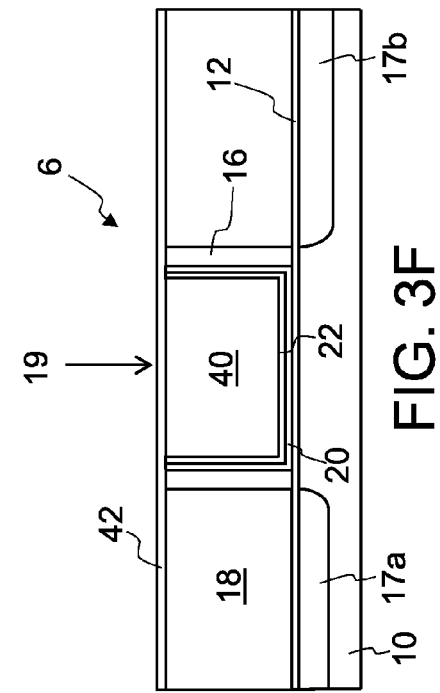
Figure 2F:
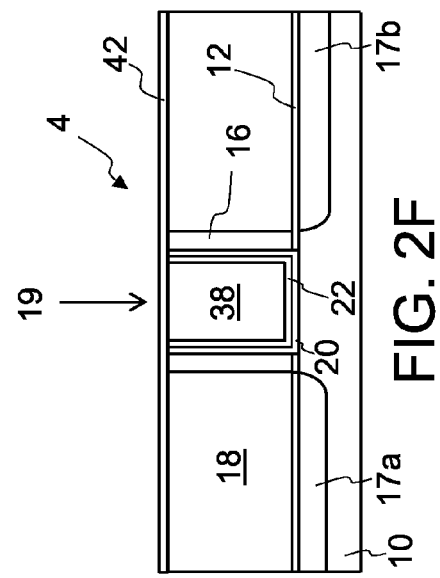

Referring to FIGS. 1A-1G for the MC area(s) 2, FIGS. 2A-2G for the LV area(s) 4, and FIGS. 3A-3G for the HV area(s) 6, there are shown cross-sectional views of the steps in the process to make a semiconductor memory device. The process begins by forming (e.g. by deposition, by growth, etc.) a layer of silicon dioxide (oxide) 12 on a substrate 10 of P type single crystalline silicon. Thereafter a layer of polysilicon (poly) is formed on the layer 12 of silicon dioxide, and a layer of silicon nitride (nitride) is formed over the poly layer. The nitride and polysilicon layers are then patterned using photolithography in which photo resist (not shown) is deposited on the nitride, selectively exposed using a mask, selectively removed to expose portions of the nitride, followed by nitride and polysilicon etches to remove the exposed portions of the nitride and polysilicon that leaves blocks of polysilicon 14 with a layer of nitride on top in each of the areas 2, 4, 6. Nitride spacers are then formed along the sides of the poly blocks 14 by nitride deposition and anisotropic etch, leaving nitride 16 on the sides and tops of poly blocks 14. A word line (WL) Vt implant can then be performed on the portions of substrate 10 adjacent poly blocks 14. An implant in LV and HV areas 4 and 6 can be performed at this time to form source and drain regions 17a and 17b, respectively, in substrate 10. The MC area can be protected from this implant with photoresist. The resulting structures are shown in FIGS. 1A, 2A and 3A.

The structures are covered with an insulation material (e.g. inter-layer dielectric—ILD) 18 followed by a chemical mechanical polish (CMP) etch using nitride 16 as the etch stop. Nitride 16 over poly blocks 14 in areas 4 and 6 is removed using a nitride etch. Nitride 16 in area 2 can be protected from this nitride etch by photo resist (not shown). Poly blocks 14 are then removed from areas 4 and 6 by a polysilicon etch, exposing oxide 12 at the bottom of trenches 19. Oxide 12 is then removed from the bottom of the trench 19 in area 4 but maintained in area 6 by an oxide etch. Exposed portions of oxide 12 in area 6 can be protected by photo resist (not shown). The resulting structures are shown in FIGS. 1B, 2B, 3B.

ILD layer 18 is then removed from area 2. An insulation layer 20 is formed over the structure in MC area 2 and in trenches 19 in LV and HV areas 4 and 6. Preferably, the insulation layer 20 includes a first layer of oxide and a second layer of a high K material (i.e. having a dielectric constant K greater than that of oxide, such as $HfO_2$, $ZrO_2$, $TiO_2$, etc.). A high K cap layer 22 (e.g. TiN) is then formed over the structure in MC area 2 and in trenches 19 in LV and HV areas 4 and 6. The resulting structures are shown in FIGS. 1C, 2C, 3C.

A photolithographic process is next performed, which covers the structures with photoresist except for a center portion of the poly block 14 in MC area 2. A series of etches are performed to remove the exposed portions of layers 22, 20 and 16, poly block 14, and layer 12, to form a trench 24 that extends down to and exposes substrate 10 (which effectively divides poly block 14 into two separate poly blocks). An implant process is used to form first (source) region 26 in the exposed portion of substrate 10. An oxide layer 28 is formed along the sidewalls of trench 24 (i.e. along the exposed surfaces of poly blocks 14) and along the bottom of trench 24 (i.e. along the exposed surface of substrate 10). Preferably oxide layer 28 is formed by oxidation. The resulting structures are shown in FIGS. 1D, 2D, 3D.

A metal material deposition and CMP etch is performed which fills trench 24 with a block 34 of metal material, and forms blocks 36 of metal material on the other sides of poly blocks 14 in MC area 2. This process also fills trench 19 in LV area 4 with a block 38 of metal material, and fills trench 19 in HV area 6 with a block 40 of metal material. The metal blocks 36 are then patterned via photolithography and metal etch to reduce their lateral size. An implant is then performed to form drain regions 32 in the substrate 10 adjacent metal blocks 36 in MC area 2. Insulation layer 30 is then formed over the structure followed by CMP etch (which also removes layers 16, 20 and 22 over poly blocks 14). The resulting structures are shown in FIGS. 1E, 2E, 3E.

A nitride layer 42 is formed over the structures. A layer of photoresist 44 is formed over nitride 42 in the MC area 2, and patterned via photolithography to form trenches 46 disposed over poly blocks 14. An oxide deposition is performed to form a layer of oxide 48 in the bottom of trenches 46. A metal deposition and CMP etch back are performed to fill trenches 46 with blocks 50 of the metal material. The resulting structures are shown in FIGS. 1F, 2F, 3F. Alternately, oxide layer 48 (or similar insulation layer such as ONO) could be formed on nitride 42, a layer of metal material formed on oxide layer 48, and the metal layer patterned via photolithography and metal etch to form blocks 50 of the metal material.

After photoresist 44 is removed, an insulation layer 52 is formed, preferably through deposition and CMP etch back. A photolithographic pattern and etch are performed to form contact trenches that extend through insulation layer 52 and any other layers to expose the substrate 10. The contact trenches are then filled with metal material through deposition and CMP etch back to form contacts 54 that are in electrical contact with drain regions 32 in the MC area 2, contacts 56 that are in electrical contact with source/drain regions 17a/17b in LV area 4, and contacts 58 that are in electrical contact with source/drain regions 17a/17b in LV area 6. The resulting structures are shown in FIGS. 1G, 2G, 3G.

The above described method simultaneously forms memory cells, low voltage logic devices and high voltage logic devices on the same semiconductor substrate using shared processing. The memory cells are formed in pairs sharing a common source region 26 and erase gate 34. Source and drain regions 26/32 have a conductivity type different than that of the surrounding substrate 10. Each memory cell further includes a floating gate 14 for controlling a first portion of the channel region 60 running between source and drain regions 26/32, a control gate 50 disposed over and insulated from the floating gate 14, and a word line gate 36 disposed over and insulated from the substrate for controlling a second portion of the channel region 60. The low voltage logic device includes a channel region 62 running between source/drain regions 17a/17b, and a gate 38 disposed over and insulated from the channel region 62 by composite insulation layer 20 and high K cap layer 22. The high voltage logic device includes a channel region 64 running between source/drain regions 17a/17b, and a gate 40 disposed over and insulated from the channel region 64 by composite insulation layer 20 and high K cap layer 22, and in addition oxide layer 12. The additional insulation provided by layer 12 results in a higher breakdown voltage for the high voltage logic device in HV area 6 compared to that of the low voltage logic device in LV area 4. These same three insulation layers are used to insulate word line gates 36 from the substrate 10. The floating gates 14 are insulated from the substrate by the same oxide layer 12 that is additionally provided in the high voltage logic devices.

In the above described processing, the same metal formation step simultaneously forms the erase gate 34 and word line gates 36 for the memory devices, the gate 38 for the low voltage logic device, and the gate 40 for the high voltage logic device. Moreover, the same insulation layers (12, 20, 22) are used to insulate the word line gates 36 (for the memory devices) and the gate 40 (for the high voltage logic device) from the substrate 10. By forming the gates of the memory cells and logic devices concurrently using the same metal gate formation processing, a reduced number of photolithographic masks is needed, and a reduced amount of thermal processes after metal gate formation is required thus reducing unwanted EOT increases and Vt drift.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. For example, erase gate 34 could be formed of polysilicon instead of a metal material. Further, as is apparent from the claims and specification, not all method steps need be performed in the exact order illustrated or claimed, but rather in any order that allows the proper formation of the memory cells and logic devices. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a semiconductor device, comprising:
    forming a memory cell on a substrate by:
        forming a first source region and a first drain region in the substrate, where a first channel region of the substrate is disposed between the first source region and the first drain region,
        forming a conductive erase gate over and insulated from the first source region,
        forming a conductive floating gate over and insulated from a first portion of the first channel region,
        forming a conductive control gate over and insulated from the conductive floating gate, and
        forming a conductive word line gate over and insulated from a second portion of the first channel region;
    forming a first logic device on the substrate by:
        forming a second source region and a second drain region in the substrate, where a second channel region of the substrate is disposed between the second source region and the second drain region, and
        forming a conductive first logic gate over and insulated from the second channel region;
    forming a second logic device on the substrate by:
        forming a third source region and a third drain region in the substrate, where a third channel region of the substrate is disposed between the third source region and the third drain region, and
        forming a conductive second logic gate over and insulated from the third channel region;
    wherein the forming of the conductive word line gate, the forming of the conductive first logic gate, and the forming of the conductive second logic gate comprise forming a conductive metal material over the substrate;
    wherein the conductive second logic gate is insulated from the third channel region by a first insulation formed over the substrate and by a second insulation formed over the substrate;
    wherein the conductive first logic gate is insulated from the second channel region by the second insulation and not by the first insulation;
    wherein the conductive erase gate is insulated from the first source region by the first insulation and by a third insulation, and not by the second insulation;
    wherein the conductive floating gate is insulated from the first portion of the first channel region by the first insulation and not by the second insulation and not by the third insulation; and
    wherein the conductive word line gate is insulated from the second portion of the first channel region by the first insulation and by the second insulation and not by the third insulation; and wherein the second insulation is a second layer of silicon dioxide and a layer of high K material.

2. A method of forming a semiconductor device, comprising:
    forming a memory cell on a substrate by:
        forming a first source region and a first drain region in the substrate, where a first channel region of the substrate is disposed between the first source region and the first drain region,
        forming a conductive erase gate over and insulated from the first source region,
        forming a conductive floating gate over and insulated from a first portion of the first channel region,
        forming a conductive control gate over and insulated from the conductive floating gate, and
        forming a conductive word line gate over and insulated from a second portion of the first channel region;
    forming a first logic device on the substrate by:
        forming a second source region and a second drain region in the substrate, where a second channel region of the substrate is disposed between the second source region and the second drain region, and
        forming a conductive first logic gate over and insulated from the second channel region;
    forming a second logic device on the substrate by:
        forming a third source region and a third drain region in the substrate, where a third channel region of the substrate is disposed between the third source region and the third drain region, and
        forming a conductive second logic gate over and insulated from the third channel region;
    wherein the forming of the conductive word line gate, the forming of the conductive first logic gate, and the forming of the conductive second logic gate comprise forming a conductive metal material over the substrate;
    wherein the conductive second logic gate is insulated from the third channel region by a first insulation formed over the substrate and by a second insulation formed over the substrate;

wherein the conductive first logic gate is insulated from the second channel region by the second insulation and not by the first insulation;

wherein the forming of the conductive erase gate comprises the forming of the conductive metal material over the substrate; and wherein the second insulation is a second layer of silicon dioxide and a layer of high K material.

3. The method of claim 1, wherein the forming of the conductive metal material comprises depositing the metal material over the substrate and removing portions of the deposited metal material using a chemical-mechanical polish process.

4. A method of forming a semiconductor device, comprising:
  forming a memory cell on a substrate by:
    forming a first source region and a first drain region in the substrate, where a first channel region of the substrate is disposed between the first source region and the first drain region,
    forming a conductive erase gate over and insulated from the first source region,
    forming a conductive floating gate over and insulated from a first portion of the first channel region,
    forming a conductive control gate over and insulated from the conductive floating gate, and
    forming a conductive word line gate over and insulated from a second portion of the first channel region;
  forming a first logic device on the substrate by:
    forming a second source region and a second drain region in the substrate, where a second channel region of the substrate is disposed between the second source region and the second drain region, and
    forming a conductive first logic gate over and insulated from the second channel region;
  forming a second logic device on the substrate by:
    forming a third source region and a third drain region in the substrate, where a third channel region of the substrate is disposed between the third source region and the third drain region, and
    forming a conductive second logic gate over and insulated from the third channel region;
  wherein the forming of the conductive word line gate, the forming of the conductive first logic gate, and the forming of the conductive second logic gate comprise forming a conductive metal material over the substrate;
  wherein the conductive second logic gate is insulated from the third channel region by a first insulation formed over the substrate and by a second insulation formed over the substrate;
  wherein the conductive first logic gate is insulated from the second channel region by the second insulation and not by the first insulation;
  wherein the first insulation is a first layer of silicon dioxide; and
  wherein the second insulation is a second layer of silicon dioxide and a layer of high K material.

5. A method of forming a semiconductor device, comprising:
  forming a memory cell on a substrate by:
    forming a first source region and a first drain region in the substrate, where a first channel region of the substrate is disposed between the first source region and the first drain region,
    forming a conductive erase gate over and insulated from the first source region,
    forming a conductive floating gate over and insulated from a first portion of the first channel region,
    forming a conductive control gate over and insulated from the conductive floating gate, and
    forming a conductive word line gate over and insulated from a second portion of the first channel region;
  forming a first logic device on the substrate by:
    forming a second source region and a second drain region in the substrate, where a second channel region of the substrate is disposed between the second source region and the second drain region, and
    forming a conductive first logic gate over and insulated from the second channel region;
  forming a second logic device on the substrate by:
    forming a third source region and a third drain region in the substrate, where a third channel region of the substrate is disposed between the third source region and the third drain region, and
    forming a conductive second logic gate over and insulated from the third channel region;
  wherein the forming of the conductive word line gate, the forming of the conductive first logic gate, and the forming of the conductive second logic gate comprise forming a conductive metal material over the substrate;
  wherein the conductive second logic gate is insulated from the third channel region by a first insulation formed over the substrate and by a second insulation formed over the substrate;
  wherein the conductive first logic gate is insulated from the second channel region by the second insulation and not by the first insulation;
  wherein the conductive erase gate is insulated from the first source region by the first insulation and by a third insulation; and
  wherein the first insulation is a first layer of silicon dioxide, the second insulation is a second layer of silicon dioxide and a layer of high K material, and the third insulation is a third layer of silicon dioxide.

6. A semiconductor memory device, comprising:
  a semiconductor substrate;
  a memory cell that comprises:
    a first source region and a first drain region in the substrate, where a first channel region of the substrate is disposed between the first source region and the first drain region,
    a conductive erase gate disposed over and insulated from the first source region,
    a conductive floating gate disposed over and insulated from a first portion of the first channel region,
    a conductive control gate disposed over and insulated from the conductive floating gate, and
    a conductive word line gate disposed over and insulated from a second portion of the first channel region;
  a first logic device that comprises:
    a second source region and a second drain region in the substrate, where a second channel region of the substrate is disposed between the second source region and the second drain region,
    a conductive first logic gate disposed over and insulated from the second channel region;
  a second logic device that comprises:
    a third source region and a third drain region in the substrate, where a third channel region of the substrate is disposed between the third source region and the third drain region,
    a conductive second logic gate disposed over and insulated from the third channel region;

wherein the conductive word line gate, the conductive first logic gate, and the conductive second logic gate all comprise a same conductive metal material;
wherein the conductive second logic gate is insulated from the third channel region by a first insulation disposed over the substrate and by a second insulation disposed over the substrate;
wherein the conductive first logic gate is insulated from the second channel region by the second insulation and not by the first insulation;
wherein the conductive erase gate is insulated from the first source region by the first insulation and by a third insulation, and not by the second insulation;
wherein the conductive floating gate is insulated from the first portion of the first channel region by the first insulation and not by the second insulation and not by the third insulation; and
wherein the conductive word line gate is insulated from the second portion of the first channel region by the first insulation and by the second insulation and not by the third insulation; and wherein the second insulation is a second layer of silicon dioxide and a layer of high K material.

7. A semiconductor memory device, comprising:
a semiconductor substrate;
a memory cell that comprises:
  a first source region and a first drain region in the substrate, where a first channel region of the substrate is disposed between the first source region and the first drain region,
  a conductive erase gate disposed over and insulated from the first source region,
  a conductive floating gate disposed over and insulated from a first portion of the first channel region,
  a conductive control gate disposed over and insulated from the conductive floating gate, and
  a conductive word line gate disposed over and insulated from a second portion of the first channel region;
a first logic device that comprises:
  a second source region and a second drain region in the substrate, where a second channel region of the substrate is disposed between the second source region and the second drain region,
  a conductive first logic gate disposed over and insulated from the second channel region;
a second logic device that comprises:
  a third source region and a third drain region in the substrate, where a third channel region of the substrate is disposed between the third source region and the third drain region,
  a conductive second logic gate disposed over and insulated from the third channel region;
wherein the conductive word line gate, the conductive first logic gate, and the conductive second logic gate all comprise a same conductive metal material;
wherein the conductive second logic gate is insulated from the third channel region by a first insulation disposed over the substrate and by a second insulation disposed over the substrate; and
wherein the conductive first logic gate is insulated from the second channel region by the second insulation and not by the first insulation;
wherein the conductive erase gate comprises the same conductive metal material; and wherein the second insulation is a second layer of silicon dioxide and a layer of high K material.

8. A semiconductor memory device, comprising:
a semiconductor substrate;
a memory cell that comprises:
  a first source region and a first drain region in the substrate, where a first channel region of the substrate is disposed between the first source region and the first drain region,
  a conductive erase gate disposed over and insulated from the first source region,
  a conductive floating gate disposed over and insulated from a first portion of the first channel region,
  a conductive control gate disposed over and insulated from the conductive floating gate, and
  a conductive word line gate disposed over and insulated from a second portion of the first channel region;
a first logic device that comprises:
  a second source region and a second drain region in the substrate, where a second channel region of the substrate is disposed between the second source region and the second drain region,
  a conductive first logic gate disposed over and insulated from the second channel region;
a second logic device that comprises:
  a third source region and a third drain region in the substrate, where a third channel region of the substrate is disposed between the third source region and the third drain region,
  a conductive second logic gate disposed over and insulated from the third channel region;
wherein the conductive word line gate, the conductive first logic gate, and the conductive second logic gate all comprise a same conductive metal material;
wherein the conductive second logic gate is insulated from the third channel region by a first insulation disposed over the substrate and by a second insulation disposed over the substrate; and
wherein the conductive first logic gate is insulated from the second channel region by the second insulation and not by the first insulation;
wherein the first insulation is a first layer of silicon dioxide; and
wherein the second insulation is a second layer of silicon dioxide and a layer of high K material.

9. A semiconductor memory device, comprising:
a semiconductor substrate;
a memory cell that comprises:
  a first source region and a first drain region in the substrate, where a first channel region of the substrate is disposed between the first source region and the first drain region,
  a conductive erase gate disposed over and insulated from the first source region,
  a conductive floating gate disposed over and insulated from a first portion of the first channel region,
  a conductive control gate disposed over and insulated from the conductive floating gate, and
  a conductive word line gate disposed over and insulated from a second portion of the first channel region;
a first logic device that comprises:
  a second source region and a second drain region in the substrate, where a second channel region of the substrate is disposed between the second source region and the second drain region,
  a conductive first logic gate disposed over and insulated from the second channel region;

a second logic device that comprises:
- a third source region and a third drain region in the substrate, where a third channel region of the substrate is disposed between the third source region and the third drain region,
- a conductive second logic gate disposed over and insulated from the third channel region;

wherein the conductive word line gate, the conductive first logic gate, and the conductive second logic gate all comprise a same conductive metal material;

wherein the conductive second logic gate is insulated from the third channel region by a first insulation disposed over the substrate and by a second insulation disposed over the substrate; and wherein the conductive first logic gate is insulated from the second channel region by the second insulation and not by the first insulation;

wherein the conductive erase gate is insulated from the first source region by the first insulation and by a third insulation; and wherein the first insulation is a first layer of silicon dioxide, the second insulation is a second layer of silicon dioxide and a layer of high K material, and the third insulation is a third layer of silicon dioxide.

* * * * *